United States Patent [19]

Yang et al.

[11] Patent Number: 6,042,994

[45] Date of Patent: Mar. 28, 2000

[54] NANOPOROUS SILICA DIELECTRIC FILMS MODIFIED BY ELECTRON BEAM EXPOSURE AND HAVING LOW DIELECTRIC CONSTANT AND LOW WATER CONTENT

[75] Inventors: Jingjun Yang, Cupertino; James S. Drage, Fremont; Lynn Forester, San Jose, all of Calif.

[73] Assignee: AlliedSignal Inc., Morristown, N.J.

[21] Appl. No.: 09/227,734

[22] Filed: Jan. 8, 1999

Related U.S. Application Data

[60] Provisional application No. 60/071,977, Jan. 20, 1998, and provisional application No. 60/071,978, Jan. 20, 1998.

[51] Int. Cl.$^7$ ..................................................... G03F 7/09
[52] U.S. Cl. .............................. 430/296; 430/271.1
[58] Field of Search ................................. 430/296, 271.1

[56] References Cited

U.S. PATENT DOCUMENTS

| | | | |
|---|---|---|---|
| 5,468,595 | 11/1995 | Livesay | 430/296 |
| 5,609,925 | 3/1997 | Camilletti et al. | 427/503 |
| 5,710,187 | 1/1998 | Steckle, Jr. et al. | 521/64 |
| 5,805,424 | 9/1998 | Purinton | 361/760 |

FOREIGN PATENT DOCUMENTS

| | | |
|---|---|---|
| 0 775 669 A2 | 5/1997 | European Pat. Off. . |
| 2 407 499 | 9/1978 | France . |
| 30 15 034 A1 | 10/1981 | Germany . |
| WO 98/43294 | 10/1998 | WIPO . |
| WO 98/46526 | 10/1998 | WIPO . |
| WO 98/47177 | 10/1998 | WIPO . |

*Primary Examiner*—Christopher G. Young
*Attorney, Agent, or Firm*—Leslie A. Weise

[57] ABSTRACT

Nanoporous silica dielectric films are modified by electron beam exposure after an optional hydrophobic treatment by an organic reactant. After formation of the film onto a substrate, the substrate is placed inside a large area electron beam exposure system. The resulting films are characterized by having a low dielectric constant and low water or silanol content compared to thermally cured films. Also, e-beam cured films have higher mechanical strength and better resistance to chemical solvents and oxygen plasmas compared to thermally cured films.

28 Claims, 1 Drawing Sheet

NANOPOROUS SILICA DIELECTRIC FILMS MODIFIED BY ELECTRON BEAM EXPOSURE AND HAVING LOW DIELECTRIC CONSTANT AND LOW WATER CONTENT

CROSS REFERENCE TO RELATED APPLICATION

This application claims the benefit of provisional application 60/071,977 filed Jan. 20, 1998 and provisional application 60/071,978 filed Jan. 20, 1998, which are incorporated herein by reference.

BACKGROUND OF THE INVENTION

1. Field of the Invention

The present invention relates to nanoporous dielectric films and to a process for their manufacture. Such films are useful in the production of integrated circuits.

2. Description of the Related Art

As feature sizes in the production of integrated circuits approach 0.18 µm and below, problems with interconnect RC delay, power consumption and crosstalk all become more significant. Integration of low dielectric constant (K) materials for interlevel dielectric (ILD) and intermetal dielectric (IMD) applications partially mitigate these problems but each of the material candidates having K significantly lower than the currently employed dense silica suffer from disadvantages. A number of organic and inorganic polymers have K in the range of 2.2 to 3.5, however, these suffer from a number of problems including low thermal stability, poor mechanical properties including low glass transition temperature (T), sample outgassing, and long term reliability questions.

Another approach has been to employ nanoporous silicas which can have dielectric constants for bulk samples in the range of 1 to 3. Nanoporous silica is attractive because it employs similar precursors (e.g., TEOS, tetraethoxysilane) as used for SOG's and CVD $SiO_2$ and because of the ability to carefully control pore size and pore size distribution. In addition to having a low dielectric constant nanoporous silica offers other advantages for microelectronics including thermal stability up to at least 500° C., small pore size (<<microelectronics features), use of precursors (e.g., TEOS) that are widely used in the-semiconductor industry, the ability to tune dielectric constant over a wide range and deposition using similar tools as employed for conventional SOG processing. High porosity leads to a lower dielectric constant than corresponding dense materials, and additional compositions and processes may be also introduced. Materials issues include the need for having all pores significantly smaller than circuit feature sizes, the strength decrease associated with porosity, and the role of surface chemistry on dielectric constant and environmental stability. Density (or the inverse, porosity) is the key nanoporous silica parameter controlling property of importance for dielectrics. Properties of nanoporous silica may be varied over a continuous spectrum from the extremes of an air gap at a porosity of 100% to dense silica with a porosity of 0%. As density increases, dielectric constant and mechanical strength increase but the pore volume decreases. The optimal porous material should have a compromise between mechanical strength and dielectric constant. Density is dependent on pore volume or porosity for a given material.

Nanoporous dielectric silica coatings can be formed by depositing a mixture of a liquid alkoxysilane precursor composition and a solvent onto a spinning silicon wafer substrate to thereby coat the substrate. The coating is typically polymerized, condensed, and cured to form a nanoporous dielectric silica coating on the substrate. EP patent application EP 0 775 669 A2, which is incorporated herein by reference, shows a method for producing a nanoporous silica film with uniform density throughout the film thickness. The preferred method for producing nanoporous dielectrics is through the use of sol-gel techniques whereby a sol, which is a colloidal suspension of solid particles in a liquid, transforms into a gel due to growth and interconnection of the solid particles. A preferred method for accelerating gel formation is to expose the alkoxysilane precursor to both water vapor and base vapor. One theory is that through continued reactions within the sol, one or more molecules within the sol may eventually reach macroscopic dimensions so that they form a solid network which extends substantially throughout the sol. At this point, called the gel point, the substance is said to be a gel. By this definition, a gel is a substance that contains a continuous solid skeleton enclosing a continuous liquid phase. As the skeleton is porous, the term "gel" as used herein means an open-pored solid structure enclosing a pore fluid.

Nanoporous silica films are principally composed of silicon and oxygen in which there are pores distributed throughout the material. The pores range in size from about 0.1 nm to about 100 nm. Nanoporous silica films can be used provided that silanol groups (Si—OH) and water are excluded from the film. Silanols and water will raise the dielectric constant of the film because they are highly polarizable in an electric field. To make nanoporous films substantially free of silanols and water, an organic reagent such as hexamethyldisilazane or methyltriacetoxysilane, is optionally introduced into the pores of the film. This reagent reacts with silanols on the pore surfaces to form trimethylsilyl groups. The latter serve to mask the silanol groups and to make the film hydrophobic. The drawback to the use of trimethylsilyl groups is that the film is no longer pure $SiO_2$. The carbon and hydrogen content may be as high as 10% by weight. In the fabrication of integrated circuits it is advantageous to use a dielectric film which will not degrade in an oxidizing environment. IC fabrication relies on highly oxidizing plasmas to remove photoresist from the top surface of insulating layers. Furthermore, oxidizing plasmas are used to deposit CVD (chemical vapor deposition) $SiO_2$ layers onto nanoporous silica. Oxidizing plasmas will readily oxidize trimethylsilyl groups from nanoporous films and this will lead to the formation of water and silanols. In addition, oxidized silica films will easily absorb water from IC manufacturing environments. The retention of water and silanols as a result of oxidation and/or absorption of water from manufacturing environments cause two problems: a significant increase in dielectric constant and difficulty in forming low resistance metal vias (the poison via problem).

Thus, it would be desirable to produce a nanoporous silica film which has a dielectric constant $\leq 2.5$, which contains low levels of water and which is stable to oxygen plasma as well as to other chemical solvents used in IC fabrication This can be accomplished in accordance with this invention, wherein nanoporous silica dielectric films are modified by electron beam exposure after an optional hydrophobic treatment by an organic reactant. The resulting films retain their nanoporous structures with reduced pore sizes, and initially have lower water content compared to thermally cured films, and hence have a dielectric constant lower than or the same as that of the thermally cured films. The resulting films have essentially no or a reduced amount of carbon and hydrogen after the electron beam process. These electron beam treated films are also not affected by oxygen plasma and chemical solvents, such as used in IC fabrication. The resistance to oxidizing plasma and chemical solvents results from the absence of methyl groups in the film as well as because of e-beam induced densification. Without the electron beam process, the oxygen plasma would react with the trimethylsilyl groups to form water. The water would raise the dielectric constant of the film and lead to high leakage current between metal lines. Although it has been previously suggested to form hydrophobic nanoporous films by treating the film with an organic surface modification reagent, the benefits of exposing such films to an electron beam were heretofore not known. Such prior art is exemplified by U.S. Pat. Nos. 5,494,858; 5,504,042; 5,523,615; and 5,470,802, as well as Ramos, et. al, "Nanoporous Silica for Dielectric Constant Less Than 2, ULSI Meeting, Boston, Mass., October 1996; Ramos, et. al, "Nanoporous Silica for ULSI Applications", 1997 Dielectrics for ULSI Multilevel Interconnection Conference (DUMIC), P. 106; and Jin, et. al., "Porous Xerogel Films as Ultra-Low Permittivity Dielectrics for ULSI Interconnect Applications", ULSI Meeting, Boston Mass., October 1996.

SUMMARY OF THE INVENTION

The invention provides a process for forming a low dielectric constant nanoporous dielectric coating on a substrate which comprises
 a) forming a nanoporous dielectric polymer composition on a substrate,
 b) optionally contacting the polymer composition with a surface modification composition;
 c) optionally heating the film to evaporate solvents from the pores of the film;
 d) exposing the polymer composition to electron beam radiation; and
 e) optionally thermally annealing the exposed polymer composition In a preferred embodiment of the invention step (a) above is conducted by a process which comprises
 i) blending at least one alkoxysilane, a solvent composition, and optional water thus forming a mixture, and causing a partial hydrolysis and partial condensation of the alkoxysilane;
 ii) depositing the mixture onto a substrate;
 iii) exposing the mixture to water vapor and a base vapor;
 iv) optionally evaporating the solvent composition and curing the alkoxysilane composition to a nanoporous dielectric silica coating.

The invention further provides a semiconductor device produced by a process which comprises:
 a) forming a nanoporous dielectric polymer composition on a semiconductor substrate,
 b) optionally contacting the polymer composition with a surface modification composition;
 c) optionally heating the film to evaporate solvents from the pores of the film;
 d) exposing the polymer composition to electron beam radiation; and
 e) optionally thermally annealing the exposed polymer composition

DETAILED DESCRIPTION OF THE PREFERRED EMBODIMENT

Figure 1:
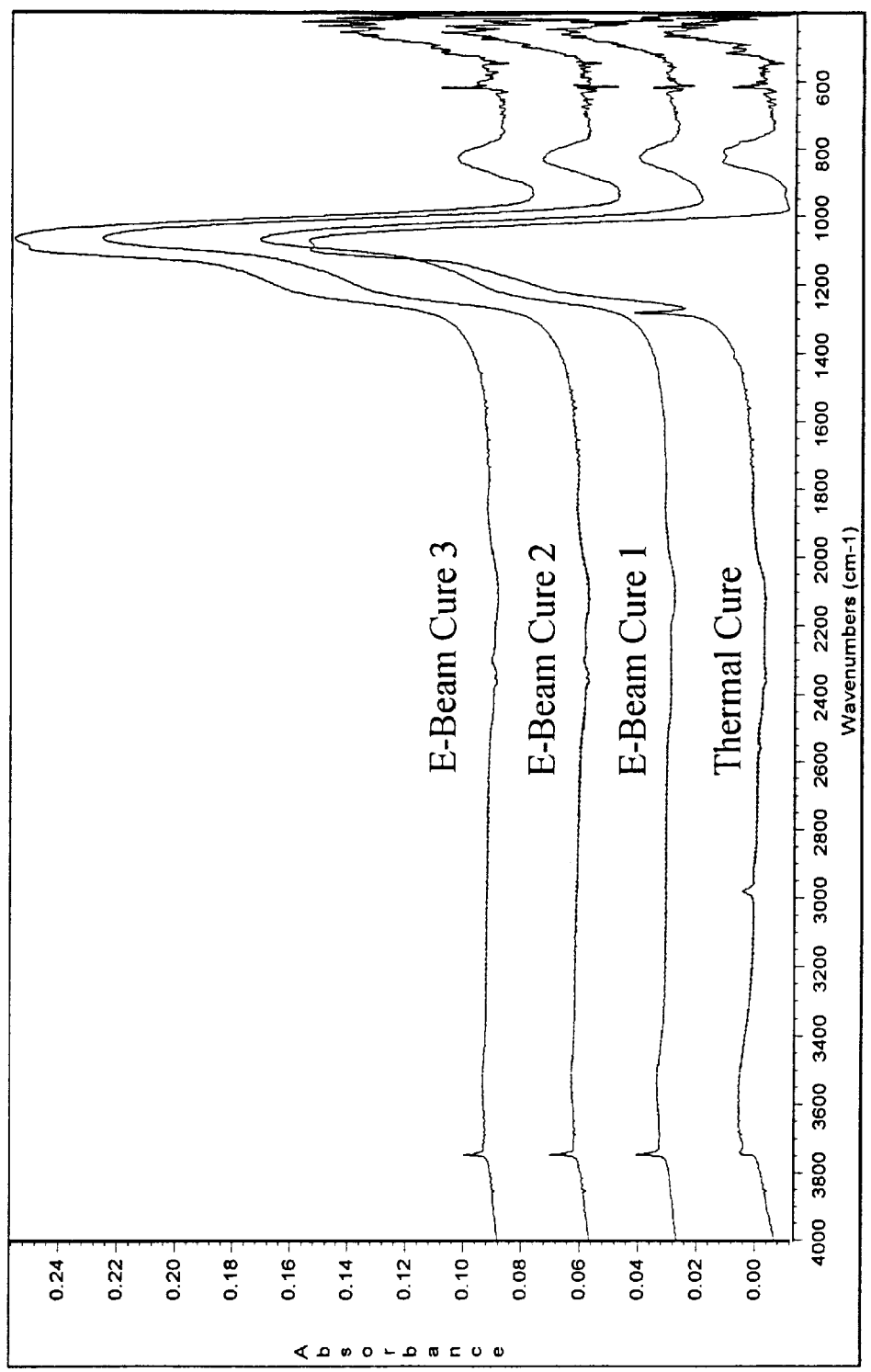
FIG. 1 shows an FTIR spectra for wafers produced according to Example 1.

In accordance with this invention, a nanoporous dielectric coating is first formed on a suitable substrate by any of several methods. Such may be formed, for example by any of the methods disclosed in U.S. patent application Ser. No. 09/046,474 filed Mar. 25, 1998; Ser. No. 09/046,473 filed Mar. 25, 1998; Ser. No. 09/054,262 filed Apr. 3, 1998; Ser. No. 09/111,082 filed Jul. 7, 1998; Ser. No. 09/111,081 filed Jul. 7, 1998; Ser. No. 09/156,220 filed Sep. 18, 1998; Ser No. 09/111,084 filed Jul. 7, 1998; 60/095,573 filed Aug. 6, 1998; 60/098,068 filed Aug. 27, 1998; Ser. No. 09/111,083 filed Jul. 7, 1998; Ser. No. 09/140,855 filed Aug. 27, 1998; 60/098,515 filed Aug. 31, 1998 and Ser. No. 09/141,287 filed Aug. 27, 1998 which are incorporated herein by reference.

Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

One technique for forming nanoporous dielectric polymer composition on the substrate is to form a reaction product from a blend of at least one alkoxysilane with a solvent composition, optional water and an optional catalytic amount of a base or an acid. The water is included to provide a medium for hydrolyzing the alkoxysilane. In the preferred embodiment the solvent composition comprises either a relatively high volatility solvent composition, a relatively low volatility solvent composition, or both a relatively high volatility solvent composition and a relatively low volatility solvent composition This reaction product is applied onto the substrate, preferably by spin coating. The high volatility solvent evaporates during and immediately after deposition of the reaction product. The reaction product is further hydrolyzed and condensed until it forms a gel layer. The second low volatility solvent is then removed by increasing the temperature.

Useful alkoxysilanes for this invention include those which have the formula:

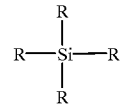

wherein at least 2 of the R groups are independently $C_1$ to $C_4$ alkoxy groups and the balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

The relatively high volatility solvent composition is one which evaporates at a temperature below, preferably significantly below that of the relatively low volatility solvent composition The relatively high volatility solvent composition preferably has a boiling point of about 120° C. or less, preferably about 100° C. or less. Suitable high volatility solvent composition nonexclusively include methanol, ethanol n-propanol, isopropanol, n-butanol and mixtures thereof Other relatively high volatility solvent compositions which are compatible with the other ingredients can be readily determined by those skilled in the art.

The relatively low volatility solvent composition is one which evaporates at a temperature above, preferably significantly above that of the relatively high volatility solvent composition The relatively low volatility solvent composition preferably has a boiling point of about 175° C. or more, preferably about 200° C. or more. Suitable low volatility solvent compositions nonexclusively include alcohols and polyols including glycols such as ethylene glycol 1,4-butylene glycol, 1,5-pentanediol 1,2,4-butanetriol, 1,2,3-butanetriol, 2-methyl-propanetriol, 2-(hydroxymethyl)-1,3-propanediol 1,4-butanediol, 2-methyl-1,3-propanediol, tetraethylene glycol, triethylene glycol monomethyl ether, glycerol and mixtures thereof. Other relatively low volatility solvent compositions which are compatible with the other ingredients can be readily determined by those skilled in the art.

The optional base or acid serves to catalyze the reaction of the alkoxysilane with the solvent and water. Suitable acids are nitric acid and compatible organic acids which are volatile, i.e. which evaporate from the resulting reaction product under the process operating conditions, and which do not introduce impurities into the reaction product.

Suitable bases nonexclusively include ammonia and amines, such as primary, secondary and tertiary alkyl amines, aryl amines, alcohol amines and mixtures thereof which have a preferred boiling point of about 200° C. or less, more preferably 100° C. or less and most preferably 25° C. or less. Preferred amines are alcoholamines, alkylamines, methylamine, monoethanol amine, diethanol amine, triethanol amine, dimethylamine, trimethylamine, n-butylamine, n-propylamine, tetramethyl ammonium hydroxide, piperidine, 2-methoxyethylamine, mono-, di- or triethanolamines, and mono-, di-, or tri-isopropanolamines. The ability of an amine to accept a proton in water is measured in terms of the basicity constant $K_b$, and $pK_b = -\log K_b$. In the preferred embodiment, the $pK_b$ of the base may range from about less than 0 to about 9, more preferably from about 2 to about 6 and most preferably from about 4 to about 5.

The alkoxysilane component is preferably present in an amount of from about 3% to about 50% by weight of the overall blend. A more preferred range is from about 5% to about 45% and most preferably from about 10% to about 40%.

The solvent is preferably present in an amount of from about 10% to about 90% by weight of the overall blend, more preferably from about 15% to about 80% and most preferably from about 40% to about 60%. When both a high and a low volatility solvent are preset the high volatility solvent component is preferably present in an amount of from about 20% to about 90% by weight of the overall blend, more preferably from about 30% to about 70% and a most preferably from about 40% to about 60% by weight of the overall blend. When both a high and a low volatility solvent are present, the low volatility solvent component is preferably present in an amount of from about 1 to about 40% by weight of the overall blend, more preferably from about 3% to about 30% and a most preferably from about 5% to about 20% by weight of the overall blend.

The mole ratio of water to silane is preferably from about 0 to about 50. A more preferred range is from about 0.1 to about 10 and most preferably from about 0.5 to about 1.5.

The acid or base is present in a catalytic amount which can be readily determined by those skilled in the art. Preferably the molar ratio of acid to silane ranges from about 0 to about 0.2, more preferably from about 0.001 to about 0.05, and most preferably from about 0.005 to about 0.02.

The formed reaction product is applied onto the substrate, preferably by spin coating. The high volatility solvent evaporates during and immediately after deposition of the reaction product. The more volatile solvent evaporates over a period of seconds or minutes resulting in film shrinkage. The reaction product is further hydrolyzed and condensed until it forms a gel layer. At this point, the film is a viscous liquid of the silica precursors and the less volatile solvent. Slightly elevated temperatures may optionally be employed to accelerate this step. Such temperatures may range from about 20° C. to about 80° C., preferably range from about 20° C. to about 50° C. and more preferably range from about 20° C. to about 35° C.

Then the coating is then preferably exposed to both a water vapor and a base vapor (the aging process). The base vapor may be introduced first followed by the water vapor or both the water vapor and the base vapor may be introduced simultaneously. The water vapor causes a continued hydrolysis of the alkoxysilane alkoxy groups, and the base catalyzes condensation of the hydrolyzed alkoxysilane and serves to increase molecular weight until the coating gels and ultimately increases gel strength. The coated substrate is placed in a sealed chamber and is evacuated to a vacuum. In the preferred embodiment, the pressure of the evacuated chamber ranges from about 0.001 torr to about 0.1 torr. Then the coating is exposed to both a water vapor and a base vapor. For purposes of this invention, a base vapor includes gaseous bases. Preferably the coating is first exposed to a water vapor and then exposed to a base vapor, however, in an alternate embodiment, the coating may first be exposed to a base vapor and then a water vapor. The first of the two exposures is conducted such that thereafter the pressure in the chamber remains at sub-atmospheric pressure. The second exposure may be conducted at atmospheric pressure, sub-atmospheric pressure or super-atmospheric pressure.

In the preferred embodiment, after the wafer is placed in the sealed aging chamber and the chamber evacuated to a vacuum, a valve is opened to a reservoir of water, and water vapor quickly fills the chamber. The partial pressure of water vapor, $P_{H2O}$ is controlled by the length of time that the valve is open and the temperature at which the liquid water reservoir is maintained. Because of the low vapor pressure of water, the chamber pressure after water addition is much less than ambient. The pressure rise that occurs in the chamber during the water vapor addition is a direct measure of the water vapor partial pressure. In the preferred embodiment, the pressure of the evacuated chamber after the water vapor exposure ranges from about 0.1 torr to about 150 torr, preferably about 1 torr to about 40 torr and more preferably from about 5 torr to about 20 torr. In the preferred embodiment, the temperature of the water during the exposure ranges from about 10° C. to about 60° C., preferably from about 15° C. to about 50° C., and more preferably from about 20° C. to about 40° C. In the preferred embodiment, the temperature in the chamber after water exposure ranges from about 10° C. to about 50° C., preferably from about 15° C. to about 40° C., and more preferably from about 20° C. to about 40° C.

Preferably water vapor is added first and then the base vapor is dosed into the chamber. The chamber pressure after base dosing may be at, above or below atmospheric pressure. If the pressure is above atmospheric, the chamber must be designed to resist the total system pressure. The order of addition of water and base may be reversed but the addition of water before the base is preferred because of its lower vapor pressure. In the preferred embodiment, the pressure of the evacuated chamber after the base vapor exposure ranges from about 100 torr to about 2,000 torr, preferably about 400 torr to about 1,000 torr and more preferably from about 600 torr to about 800 torr. In the preferred embodiment, the temperature of the base during the exposure ranges from about 10° C. to about 60° C., preferably from about 15° C. to about 40° C., and more preferably from about 20° C. to about 30° C. In the preferred embodiment, the temperature in the chamber after base exposure ranges from about 10° C. to about 50° C., preferably from about 15° C. to about 40° C., and more preferably from about 20° C. to about 40° C.

Suitable bases for use in the base vapor nonexclusively include ammonia and amines, such as primary, secondary and tertiary allyl amines, aryl amines, alcohol amines and mixtures thereof which have a boiling point of about 200° C. or less, preferably 100+ C. or less and more preferably 25° C. or less. Preferred amines are methylamine, dimethylamine, trimethylamine, n-butylamine, n-propylamine, tetramethyl ammonium hydroxide, piperidine and 2-methoxyethylamine. In the preferred embodiment, the $pK_b$ of the base may range from about less than 0 to about 9. A more preferred range is from about 2 to about 6 and most preferably from about 4 to about 5.

In the preferred embodiment, the mole ratio of water vapor to base vapor ranges from about 1:3 to about 1:100, preferably from about 1:5 to about 1:50, and more preferably from about 1:10 to about 1:30.

The water vapor causes a continued hydrolysis of the alkoxysilane alkoxy groups, and the base catalyzes condensation of the hydrolyzed alkoxysilane and serves to increase molecular weight until the coating gels and ultimately increases gel strength. The film is then dried in a conventional way by evaporation of the less volatile solvent. Elevated temperatures may be employed to dry the coating in this step. Such temperatures may range from about 20° C. to about 450° C., preferably from about 50° C. to about 350° C. and more preferably from about 175° C. to about 320° C.

After the desired time of reaction after base addition, on the order of seconds to a few minutes, the chamber pressure is brought to atmospheric pressure. This can be accomplished by either adding an inert gas such as nitrogen and opening the chamber or evacuating the base/water mixture via vacuum and backfilling with an inert gas.

As a result, a relatively high porosity, low dielectric constant, silicon containing polymer composition forms on the substrate. The silicon containing polymer composition preferably has a dielectric constant of from about 1.1 to about 3.5, more preferably from about 1.3 to about 3.0, and most preferably from about 1.5 to about 2.5. The pore size of silica composition ranges from about 1 nm to about 100 nm, more preferably from about 2 nm to about 30 nm, and most preferably from about 3 nm to about 20 nm. The density of the silicon containing composition, including the pores, ranges from about 0.1 to about 1.9 $g/cm^2$, more preferably from about 0.25 to about 1.6 $g/cm^2$, and most preferably from about 0.4 to about 1.2 $g/cm^2$.

In an optional additional step, the nanoporous dielectric film on the substrate may be reacted with an effective amount of a surface modification composition for a period of time sufficient for the surface hydrophobizing composition to penetrate the pore structure and render it hydrophobic. The surface modification must be conducted after aging but may be conducted either before or after drying. The surface modification composition is hydrophobic and suitable for silylating silanol moieties on the hydrophilic pore surfaces. Preferably the surface modification agent is a compound having a formula selected from the group consisting of: $R_3SiNHSiR_3$, $R_xSiCl_y$, $R_xSi(OH)_y$, $R_3SiOSiR_3$, $R_xSi(OR)_y$, $M_pSi(OH)_{[4-p]}$, $R_xSi(OCOCH_3)_y$ and combinations thereof, wherein x is an integer ranging from 1 to 3, y is an integer ranging from 1 to 3 such that y=4−x, p is an integer ranging from 2 to 3; each R is an independently selected hydrophobic organic moiety; each M is an independently selected hydrophobic organic moiety; and R and M can be the same or different. The R and M groups are preferably independently selected from the group of organic moieties consisting of alkyl, aryl and combinations thereof. The alkyl moiety is substituted or unsubstituted and is selected from the group consisting of straight allyl branched alkyl, cyclic alkyl and combinations thereof and wherein said alkyl moiety ranges in size from $C_1$ to about $C_{18}$. The aryl moiety is substituted or unsubstituted and ranges in size from $C_5$ to about $C_{18}$. Preferably the hydrophobizing composition comprises acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene4-one, n-(trimethylsilyl) acetamide, 2-(trimethylsilyl) acetic acid, n-(trimethylsilyl) imidazole, trimethylsilylpropiolate, trimethylsilyl (trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol or combinations thereof Most preferably the hydrophobizing composition comprises hexamethyldisilazane. The surface modification agent may be mixed with a suitable solvent such as acetone, applied to the nanoporous silica surface in the form of a vapor, and then dried.

In an optional but preferred step, the treated wafer is then heated for a time and at a temperature sufficient to evaporate the solvents from the pores of the film. This may be conducted, for example by a hot plate heat treatment at a temperature of from about 170°0 C. to about 320° C. for about 30 seconds to about 5 minutes, preferably for from about 1 to about 2 minutes.

After formation of the nanoporous film which may or may not have been treated with the surface modifying agent, the substrate is placed inside the chamber of a large area electron beam exposure system, such as that described in U.S. Pat. No. 5,003,178 to Livesay, the disclosure of which is incorporated herein by reference. This apparatus exposes the entire substrate to an electron beam flux all at once. The electron beam exposure is done at a vacuum in the range of from about $10^{-5}$ to about $10^2$ torr, and with a substrate temperature in the range of from about 25° C. to about 1050° C. The electron energy and doses will fall into the ranges of about 0.5 to about 30 KeV and about 500 to about 100,000

μC/cm², respectively. The nanoporous dielectric is subjected to an electron beam radiation from a uniform large-area electron beam source under conditions sufficient to anneal the nanoporous dielectric film. Preferably the exposure is conducted with an electron beam which covers an area of from about 4 square inches to about 256 square inches. The gaseous ambient in the electron beam system chamber may be nitrogen, argon, oxygen, or any combinations of these gases. Hydrogen or forming gas may also be used as the ambient gas. As an optional step, the films are thermally annealed before and after the electron beam treatment. This annealing process may be achieved by heating the substrate at a temperature in the range of about 200 to about 1050° C. over a period in the range of about 1 to about 360 minutes. The annealing process can be performed in an oven, tube furnace, or hot plate at atmospheric pressure. The annealing process may also be done in a vacuum This thermal annealing causes a crosslinking and densification of the surface.

The electron beam treatment can be performed in such a way that either the entire film or only an upper portion (for example, about the top 5 to 75%) of the nanoporous film is affected by the electron beam. The metal interconnect vias will intersect this upper portion of the nanoporous film which is rendered inert toward oxidizing plasmas.

The following non-limiting examples serve to illustrate the invention.

EXAMPLE 1
Removal of Water and Organic Species

Four wafers were coated with a tetraethoxysilane nanoporous silica precursor. The resulting films were aged in an aging chamber using water and ammonia vapors, followed by treatment with methyltriacetoxysilane (MTAS), a surface modification agent. The films were then heated for one minute at 175° C. and one minute at 320° C. After the above processes, the first wafer (Thermal Cure) was thermally cured in a horizontal furnace at 400° C. for 30 minutes under atmospheric pressure with nitrogen flow of 67 l/min. The second wafer (E-Beam Cure 1) was cured using electron beam under the following conditions: Energy: 4 KeV, E-Beam Dosage: 3000 μC/cm², Temperature: 350° C., Current: 15 mA in Nitrogen ambient. The third wafer (E-Beam Cure 2) was also cured using electron beam under conditions of Energy: 4 KeV, E-Beam Dosage: 6000 μC/cm², Temperature: 350° C., Current: 15 mA in Nitrogen ambient. The fourth wafer was first cured thermally in the same manner as the first wafer) and then subjected to e-beam curing under the same condition as the third wafer (E-Beam Cure 4). Film thickness and refractive index were measured using J. A. Woollam Co., Inc. VASE® spectroscopic ellipsometer. Film shrinkage was calculated based on the difference in film thickness before and after cure, and the normalized water content was calculated based on the FTIR measurement. Table 1 presents refractive index, shrinkage and normalized water content. The e-beam cure slightly increased refractive index of the film, but the water content was significantly lower than that for thermal cure. FIG. 1 shows FTIR spectra for these wafers, showing that the e-beam cure has removed most of the organic species from the film

EXAMPLE 2

Three wafers were prepared using the same method as used in Example 1. One wafer was thermally cured at 400° C. for 30 minutes and the other two wafers were cured using e-beam under conditions of E-Beam Cure-1: Energy: 1 KeV, Dose: 5000 μC/cm², Temperature: 350° C., Current: 15 mA in nitrogen ambient, and E-Beam Cure 2: Energy: 2 KeV, Dose: 5000 μC/cm², Temperature: 350° C., Current: 15 mA in nitrogen ambient. After either thermal cure or e-beam cure, aluminum dots having variable sizes (1–3 mm in diameter) were coated onto the top of the coated wafers to form a capacitor structure using a conventional metal deposition tool. The measured dielectric constant data are given in Table 2.

EXAMPLE 3
Improvement of Oxygen ($O_2$) Plasma Resistance

Three wafers were coated with a tetraethoxysilane nanoporous silica precursor and aged in an aging chamber for 4 minutes; followed by treatment with a surface modification reagent, hexamethyldisilazane (HMDZ). The films were then heated for one minute at 175° C. and one minute at 320° C. After the above processes, the first wafer (Thermal Cure) was thermally cured in a horizontal furnace at 400° C. for 30 minutes under atmospheric pressure with nitrogen flow of 67 l/min. The second wafer (E-Beam Cure 1) was cured using electron beam under conditions of Energy: 2 KeV, E-Beam Dosage: 5000 μC/cm², Temperature: 350° C., Current: 10 mA in Nitrogen ambient. The third wafer (E-Beam Cure 2) was also cured using electron beam under conditions of Energy: 3 KeV, E-Beam Dosage: 2500 μC/cm², Temperature: 350° C., Current: 10 mA in Nitrogen ambient. Then, all three wafers were exposed to oxygen plasma in GaSonics Aura 1000 under the following conditions: RF Time: 60 seconds, Oxygen Flow: 4.5 slpm, Nitrogen Flow: 0.45 slpm, Lamp 1: 7 Seconds, Lamp 2: 45 Seconds, Lamp 3: 7 Seconds. Film thickness was measured using J. A. Woollam Co., Inc. VASE® spectroscopic ellipsometer.

The Table 3 presents measured film thickness, data obtained before and after oxygen plasma exposure, and thickness loss which is calculated according to the following formula: Thickness Loss (%)=100*(T1−T2)/T1, where T1 and T2 are the thickness before and after oxygen plasma exposure, respectively.

EXAMPLE 4
Improvement in Solvent Resistance

Nanoporous silica films surface treated with HMDZ were prepared using the same method as used in Example 3. One wafer was thermally cured at 400° C. for 30 minutes, and another wafers was cured using electron beam under the following conditions: Energy: 2 KeV, Dose: 5000 μC/cm², Temperature: 350° C., Current: 10 mA and Nitrogen ambient. The solvent used in this experiment is ACT-CMI, an amine based solvent which is commercially available from the Ashland Chemical Co. The solvent test was conducted by immersing the coated wafers in the solvent for variable times (for example, in this case, 5, 10, 30 and 60 minutes), then followed by an isopropyl alcohol rinse, a DI water rinse and heating on a hot plate at a temperature of 250° C. for 5 minutes. Then, the film thickness was measured using J. A. Woollam Co., Inc. VASE® spectroscopic ellipsometer, and compared with the pre-test thickness of the film. As shown in Table 4, the film thickness loss for the thermally-cured film is significantly greater than that for the e-beam cured and this trend seems more severe for the longer immersion times.

In another solvent resistance test, nanoporous silica films were prepared using the same method as used in Example 1. One wafer was thermally cured at 400° C. for 30 minutes, and another wafer was cured using electron beam under the following conditions: Energy: 4 KeV, Dose: 6000 μC/cm², Temperature: 350° C., Current: 15 mA and Nitrogen ambient. The solvent used in this experiment is ACT-690 which is also commercially available from Ashland Chemical Co.

The solvent test procedure was exactly the same as in the previous example. The post-test thickness was also measured using J. A. Woollam Co., Inc. VASE® spectroscopic ellipsometer, and compared with the pre-test thickness of the film. As shown in Table 5, the thickness loss for the thermally-cured film started at about 10 minutes and half of the film thickness was removed when the immersion time was 30 minutes. However, for the e-beam cured film, the loss of film thickness was only 3% for the 30 minutes immersion

EXAMPLE 5

Improvement of Mechanical Strength

Three wafers were coated with a tetraethoxysilane nanoporous silica precursor. The resulting films were aged in an aging chamber using water and ammonia vapors. The films were then treated with the surface modification reagent, MTAS. One wafer was cured thermally at 400° C. for 30 minutes and the other two wafers cured using e-beam under the conditions of E-Beam Cure 1: Energy: 4 KeV, Dosage: 3000 $\mu$C/cm2, Temperature: 350° C., Current: 15 mA, Nitrogen Ambient, and E-Beam Cure 2: Energy: 4 KeV, Dosage: 6000 $\mu$C/cm2, Temperature: 350° C., Current: 15 mA, Nitrogen Ambient. Mechanical strength test was conducted using the conventional stud-pull testing method with Sebastion V instrument. For each of the wafers, about 15 samples were prepared and tested. Table 6 shows the averaged stud-pull test results for each of the three wafers. Electron beam curing enhanced the mechanical strength by at least about 50%.

TABLE 1

Refractive index, shrinkage and normalized water content for thermally-cured and e-beam cured tetraethoxysilane films

|  | Thermal Cure | E-Beam Cure 1 | E-Beam Cure 2 | E-Beam Cure 3 |
|---|---|---|---|---|
| Refractive Index | 1.158 | 1.167 | 1.160 | 1.168 |
| Shrinkage (%) | 3.1 | 16.2 | 18.1 | 19.1 |
| Normalized Water Content (%) | 100 | 56 | 48 | 37 |

TABLE 2

| Wafer ID | Curing Method | Dielectric Constant |
|---|---|---|
| Thermal Cure | Thermal Cure at 400° C. for 30 minutes | 2.2 |
| E-Beam Cure-1 | E-Beam: 1 KeV, 5000 $\mu$C/cm$^2$, 350° C., 15 mA | 2.0 |
| E-Beam Cure-2 | E-Beam: 2 KeV, 5000 $\mu$C/cm$^2$, 350° C., 15 mA | 2.2 |

TABLE 3

Thickness before and after O$_2$- Plasma exposure and Thickness Loss

|  | Thermal Cure | E-Beam Cure 1 | E-Beam Cure 2 |
|---|---|---|---|
| Thickness before O$_2$ Plasma | 8823 | 6834 | 6975 |
| Thickness after O$_2$ Plasma | 7280 | 6619 | 6892 |
| Thickness Loss (%) | 17.5 | 3.1 | 1.2 |

TABLE 4

Comparison of thickness loss for thermally-cured and e-beam cured tetraethoxysilane films after immersing test in the ACT-CMI solvent

|  | Thickness Loss (%) after Solvent Test Immersion Time in ACT-CMI Solvent | | | |
|---|---|---|---|---|
| Curing Method | 5 min. | 10 min. | 30 min. | 60 min. |
| Thermal Cure | 4 | 10 | 17 | 35 |
| E-Beam Cure | 0 | 0 | 3 | 6 |

TABLE 5

Comparison of thickness loss for thermally-cured and e-beam cured tetraethoxysilane films after immersion in ACT-690 solvent.

|  | Thickness Loss (%) after Solvent Test Immersion Time in ACT-690 Solvent | | | |
|---|---|---|---|---|
| Curing Method | 2 min. | 5 min. | 10 min. | 30 min. |
| Thermal Cure | 0 | 0 | 3 | 46 |
| E-Beam Cure | 0 | 0 | 0 | 3 |

TABLE 6

Stud-pull test results for mechanical of strength of thermally-cured and e-beam cured tetraethoxysilane films

|  | Thermal Cure | E-Beam Cure 1 | E-Beam Cure 2 |
|---|---|---|---|
| Mechanical Strength (kpsi) | 2.56 | 3.83 | 4.32 |
| Standard Deviation (%) | 1.04 | 0.84 | 1.02 |

What is claimed is:

1. A process for forming a low dielectric constant nanoporous dielectric coating on a substrate which comprises
   a) forming a nanoporous dielectric polymer composition on a substrate,
   b) optionally contacting the polymer composition with a surface modification composition;
   c) optionally heating the film to evaporate solvents from the pores of the film;
   d) exposing the polymer composition to electron beam radiation; and
   e) optionally thermally annealing the exposed polymer composition.

2. The process of claim 1 wherein the electron beam exposure is done at a vacuum in the range of from about $10^{-5}$ to about $10^2$ torr, and with a substrate temperature in the range of from about 25° C. to about 1050° C.

3. The process of claim 1 wherein the electron beam exposing is conducted at an energy ranging from about 0.5 to about 30 KeV.

4. The process of claim 1 wherein the electron beam exposing is conducted at an electron dose ranging from about 500 to about 100,000 $\mu$C/cm$^2$.

5. The process of claim 1 wherein the electron beam exposing is conducted with a wide, large beam of electron beam radiation from a uniform large-area electron beam source.

6. The process of 1 wherein the electron beam exposing is conducted with a wide, large beam of electron beam radiation from a uniform large-area electron beam source which covers an area of from about 4 square inches to about 256 square inches.

7. The process of claim 1 wherein the thermal annealing process is conducted by heating the substrate at a temperature in the range of about 200 to about 1050° C. over a period of from about 1 to about 360 minutes.

8. The coated substrate produced according to the process of claim 1.

9. The process of claim 1 wherein step (a) is conducted by a process which comprises
   i) depositing an alkoxysilane composition onto a surface of a substrate, which alkoxysilane composition comprises at least one alkoxysilane, a solvent composition, optional water, an optional base, an optional acid;
   ii) curing the alkoxysilane composition to a nanoporous dielectric silica coating.

10. The process of claim 9 wherein the base catalyst is selected from the group consisting of ammonia, primary alkyl amines, secondary alkyl amines, tertiary alkyl amines, aryl amines, alcohol amines and mixtures thereof.

11. The process of claim 9 wherein the alkoxysilane has the formula:

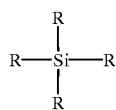

wherein at least 2 of the R groups are independently $C_1$ to $C_4$ alkoxy groups and the balance, if any, are independently selected from the group consisting of hydrogen, alkyl, phenyl, halogen, substituted phenyl.

12. The process of claim 10 wherein each R is methoxy, ethoxy or propoxy.

13. The process of claim 10 wherein the alkoxysilane composition comprises at least one organic solvent selected from the group consisting of methanol, ethanol, n-propanol, isopropanol, n-butanol, ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol, and mixtures thereof.

14. The process of claim 1 wherein the substrate comprises silicon or gallium arsenide.

15. The process of claim 1 wherein the substrate comprises at least one semiconductor material.

16. The process of claim 14 wherein the semiconductor material is selected from the group consisting of gallium arsenide, silicon, and compositions containing silicon such as crystalline silicon, polysilicon, amorphous silicon, epitaxial silicon, and silicon dioxide, and mixtures thereof.

17. The process of claim 1 wherein the substrate has a pattern of lines on its surface.

18. The process of claim 16 wherein the lines comprise a metal, an oxide, a nitride or an oxynitride.

19. The process of claim 1 wherein the nanoporous dielectric coating has a dielectric constant of from about 1.1 to about 3.5.

20. The process of claim 1 comprising the step (b) of contacting the polymer composition with a surface modification composition.

21. The process of claim 19 the surface modification composition comprises a compound having a formula selected from the group consisting of: $R_3SiNHSiR_3$, $R_xSiCl_y$, $R_xSi(OH)_y$, $R_3SiOSiR_3$, $R_xSi(OR)_y$, $M_pSi(OH)_{[4-p]}$, $R_xSi(OCOCH_3)_y$ and combinations thereof, wherein x is an integer ranging from 1 to 3, y is an integer ranging from 1 to 3 such that y=4−x, p is an integer ranging from 2 to 3; each R is an independently selected hydrophobic organic moiety; each M is an independently selected hydrophobic organic moiety; and R and M can be the same or different.

22. The process of claim 19 wherein the surface modification composition comprises a component selected from the group consisting of acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene-4-one, n-(trimethylsilyl)acetamide, 2-(trimethylsilyl)acetic acid, n-(trimethylsilyl)imidazole, trimethylsilylpropiolate, trimethylsilyl(trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol and combinations thereof.

23. The process of claim 19 wherein the surface modification composition comprises hexamethyldisilazane.

24. The process of claim 19 wherein the surface modification composition comprises methyltriacetoxysilane.

25. The coated substrate formed by the process of claim 9.

26. The process of claim 1 wherein step (a) is conducted by a process which comprises
   i) blending at least one alkoxysilane, a solvent composition, and optional water thus forming a mixture, and causing a partial hydrolysis and partial condensation of the alkoxysilane;
   ii) depositing the mixture onto a substrate;
   iii) exposing the mixture to water vapor and a base vapor,
   iv) optionally evaporating the solvent composition and curing the alkoxysilane composition to a nanoporous dielectric silica coating.

27. The coated substrate formed by the process of claim 25.

28. A semiconductor device produced by a process which comprises:
   a) forming a nanoporous dielectric polymer composition on a semiconductor substrate,
   b) optionally contacting the polymer composition with a surface modification composition;
   c) optionally heating the film to evaporate solvents from the pores of the film;
   d) exposing the polymer composition to electron beam radiation; and
   e) optionally thermally annealing the exposed polymer composition.

* * * * *